(12) United States Patent
Demura et al.

(10) Patent No.: US 10,773,425 B2
(45) Date of Patent: *Sep. 15, 2020

(54) IMPRINT TEMPLATE MANUFACTURING APPARATUS AND IMPRINT TEMPLATE MANUFACTURING METHOD

(71) Applicants: SHIBAURA MECHATRONICS CORPORATION, Yokohama-shi (JP); TOSHIBA MEMORY CORPORATION, Minato-ku (JP)

(72) Inventors: Kensuke Demura, Yokohama (JP); Satoshi Nakamura, Yokohama (JP); Daisuke Matsushima, Yokohama (JP); Masayuki Hatano, Minato-ku (JP); Hiroyuki Kashiwagi, Minato-ku (JP)

(73) Assignees: SHIBAURA MECHATRONICS CORPORATION, Yokohama-shi (JP); TOSHIBA MEMORY CORPORATION, Minato-ku (JP)

( * ) Notice: Subject to any disclaimer, the term of this patent is extended or adjusted under 35 U.S.C. 154(b) by 232 days.

This patent is subject to a terminal disclaimer.

(21) Appl. No.: 15/860,044

(22) Filed: Jan. 2, 2018

(65) Prior Publication Data
US 2018/0117795 A1    May 3, 2018

Related U.S. Application Data

(63) Continuation of application No. PCT/JP2016/070800, filed on Jul. 14, 2016.

(30) Foreign Application Priority Data

Jul. 14, 2015   (JP) .................................. 2015-140425

(51) Int. Cl.
*B29C 33/42*    (2006.01)
*B05C 5/02*     (2006.01)
(Continued)

(52) U.S. Cl.
CPC ........ *B29C 33/3842* (2013.01); *B05C 5/0204* (2013.01); *B29C 33/42* (2013.01);
(Continued)

(58) Field of Classification Search
CPC ..... G03F 7/0002; B29C 59/002; B29C 59/02; B29C 33/42; B82Y 40/00; B82Y 10/00
See application file for complete search history.

(56) References Cited

U.S. PATENT DOCUMENTS

2010/0044921 A1* 2/2010 Ito .................... G03F 7/0002
                                                       134/1
2010/0264113 A1* 10/2010 Yoneda ............. G03F 7/0002
                                                        216/41
(Continued)

FOREIGN PATENT DOCUMENTS

CN      103079788 A      5/2013
JP      04-266938        9/1992
(Continued)

OTHER PUBLICATIONS

International Search Report dated Sep. 13, 2016 in PCT/JP2016/070800 filed Jul. 14, 2016 (with English Translation).

*Primary Examiner* — Binu Thomas
(74) *Attorney, Agent, or Firm* — Oblon, McClelland, Maier & Neustadt, L.L.P.

(57) ABSTRACT

According to one embodiment, an imprint template manufacturing apparatus includes: a supply head that supplies a liquid-repellent material in liquid form to a template having a convex portion where a concavo-convex pattern is formed on a stage; a moving mechanism that moves the stage and the supply head relatively in a direction along the stage; a controller that controls the supply head and the moving mechanism such that the supply head applies the liquid-repellent material to at least a side surface of the convex portion so as to avoid the concavo-convex pattern; and a
(Continued)

cleaning unit that supplies a liquid to the template coated with the liquid-repellent material. The liquid-repellent material contains a liquid-repellent component and a non-liquid-repellent component that react with the surface of the template, and a volatile solvent that dissolves the liquid-repellent component. The liquid is a fluorine-based volatile solvent that dissolves the non-liquid-repellent component.

5 Claims, 5 Drawing Sheets

(51) Int. Cl.

| | | |
|---|---|---|
| B29C 59/02 | (2006.01) | |
| G03F 7/00 | (2006.01) | |
| B29C 33/38 | (2006.01) | |
| B29C 33/72 | (2006.01) | |
| B29C 59/00 | (2006.01) | |
| B29L 31/00 | (2006.01) | |

(52) U.S. Cl.
CPC ............ B29C 33/72 (2013.01); B29C 59/002 (2013.01); B29C 59/02 (2013.01); G03F 7/0002 (2013.01); B29C 2033/426 (2013.01); B29L 2031/757 (2013.01)

(56) References Cited

U.S. PATENT DOCUMENTS

| | | |
|---|---|---|
| 2011/0244131 A1 | 10/2011 | Kawamura et al. |
| 2012/0097336 A1* | 4/2012 | Terada .................. G03F 7/0002 |
| | | 118/719 |
| 2013/0064415 A1 | 3/2013 | Ota |
| 2014/0209565 A1 | 7/2014 | Nakamura et al. |
| 2015/0054188 A1* | 2/2015 | Ota ........................ B29C 33/72 |
| | | 264/39 |
| 2016/0247673 A1* | 8/2016 | Tsuji ..................... G03F 7/0002 |
| 2018/0015497 A1* | 1/2018 | Nakamura ............ G03F 7/0002 |
| 2018/0016673 A1* | 1/2018 | Nakamura ............ G03F 7/0002 |
| 2018/0117796 A1* | 5/2018 | Demura ................ G03F 7/0002 |

FOREIGN PATENT DOCUMENTS

| | | |
|---|---|---|
| JP | 04-270734 | 9/1992 |
| JP | 2008-100378 | 5/2008 |
| JP | 2010-251601 | 11/2010 |
| JP | 2011-133750 | 7/2011 |
| JP | 2011-224965 | 11/2011 |
| JP | 2012-164787 | 8/2012 |
| JP | 5537517 | 7/2014 |
| JP | 2014-160754 | 9/2014 |
| JP | 2016-157785 | 9/2016 |

* cited by examiner

FIG.9

| TYPE OF SOLVENT | RESULT |
|---|---|
| SURFACTANT | × (FAIL) |
| ACID SOLVENT | × (FAIL) |
| ALKALI SOLVENT | × (FAIL) |
| ORGANIC SOLVENT | × (FAIL) |
| FLUORINE-BASED SOLVENT | ○ (PASS) |

IMPRINT TEMPLATE MANUFACTURING APPARATUS AND IMPRINT TEMPLATE MANUFACTURING METHOD

CROSS-REFERENCE TO RELATED APPLICATION

This application is based upon and claims the benefit of priority from International Application No. PCT/JP2016/070800, filed on Jul. 14, 2016 and Japanese Patent Application No. 2015-140425, filed on Jul. 14, 2015; the entire contents of all of which are incorporated herein by reference.

FIELD

Embodiments described herein relate generally to an imprint template manufacturing apparatus and an imprint template manufacturing method.

BACKGROUND

In recent years, an imprinting method has been proposed as a method for forming a fine pattern on a workpiece such as a semiconductor substrate. In this imprinting method, a mold (master) having a concavo-convex pattern formed thereon is pressed against the surface of a liquid transfer-receiving material (for example, photocurable resin) applied on a workpiece. Then, light is irradiated from the mold side to the liquid transfer-receiving material, and the mold is removed from the cured transfer-receiving material. Thereby, the concavo-convex pattern is transferred to the transfer-receiving material. A template is used as the mold to be pressed against the surface of the liquid transfer-receiving material. This template is also called mold, imprint mold or stamper.

The template is formed of quartz or the like having high translucency so that light such as ultraviolet rays is easily transmitted in a step (transfer step) of curing the transfer-receiving material. The template is provided with a convex portion (convexity) on its main surface, and the above-described concavo-convex pattern to be pressed against the liquid transfer-receiving material is formed on the convex portion. For example, the convex portion having a concavo-convex pattern is referred to as "mesa portion", and a portion other than the mesa portion on the main surface of the template is referred to as "off-mesa portion".

However, when the template is pressed against the liquid transfer-receiving material, the liquid transfer-receiving material seeps out from the end of the convex portion. Although it is a small amount, the liquid transfer-receiving material having seeped out may sometimes be raised along the side surface (side wall) of the convex portion. The transfer-receiving material adhering to the side surface of the convex portion is cured in that state by light irradiation. Accordingly, when the template is separated from the transfer-receiving material, a raised portion is present in the transfer-receiving material, resulting in the occurrence of pattern abnormality.

In addition, when the template is separated from the transfer-receiving material, the raised portion of the transfer-receiving material sticks to the template. It thereafter may drop on the transfer-receiving material at some timing and become dust. If the template is pressed onto the dropped dust, the concavo-convex pattern on the template may be damaged, or the dropped dust enters in the concavo-convex pattern on the template and becomes foreign matter. As a result, template abnormality occurs. Further, if pattern transfer is continuously performed using a template having such a damaged concavo-convex pattern or a template into which a foreign matter has entered, a defect is generated in the pattern of the transfer-receiving material, resulting in the occurrence of pattern abnormality.

BRIEF DESCRIPTION OF THE DRAWINGS

FIG. 9 is a diagram for explaining the result of determination on the repellency of a liquid-repellent layer that depends on the type of cleaning liquid.

DETAILED DESCRIPTION

In general, according to one embodiment, a template manufacturing apparatus includes: a stage configured to support a template that includes a base having a main surface, and a convex portion provided on the main surface and having an end surface on which a concavo-convex pattern to be pressed against a liquid transfer-receiving material is formed; a supply head configured to supply a liquid-repellent material in liquid form, which repels the liquid transfer-receiving material, to the template on the stage; a moving mechanism configured to move the stage and the supply head relative to each other in a direction along the stage; a controller configured to control the supply head and the moving mechanism such that the supply head applies the liquid-repellent material to at least a side surface of the convex portion so as to avoid the concavo-convex pattern; and a cleaning unit configured to supply a liquid to the template coated with the liquid-repellent material. The liquid-repellent material contains a liquid-repellent component that reacts with a surface of the template, a non-liquid-repellent component that reacts with the surface of the template, and a volatile solvent that dissolves the liquid-repellent component. The liquid is a fluorine-based volatile solvent that dissolves the non-liquid-repellent component.

According to another embodiment, a template manufacturing method includes: supporting a template that includes a base having a main surface, and a convex portion provided on the main surface and having an end surface on which a concavo-convex pattern to be pressed against a liquid transfer-receiving material is formed; applying a liquid-repellent material in liquid form, which repels the liquid transfer-receiving material, to at least a side surface of the convex portion of the template supported so as to avoid the concavo-convex pattern; and supplying a liquid to the template coated with the liquid-repellent material. The liquid-repellent material contains a liquid-repellent component that reacts with a surface of the template, a non-liquid-repellent component that reacts with the surface of the template, and a volatile solvent that dissolves the liquid-repellent component. The liquid is a fluorine-based volatile solvent that dissolves the non-liquid-repellent component.

An embodiment will be described with reference to the drawings. The imprint template manufacturing apparatus according to the embodiment is an example of manufacturing apparatuses including coating application apparatuses that apply a liquid-repellent material in liquid form onto a template to coat a part of the template.

(Basic Configuration)

Figure 1:
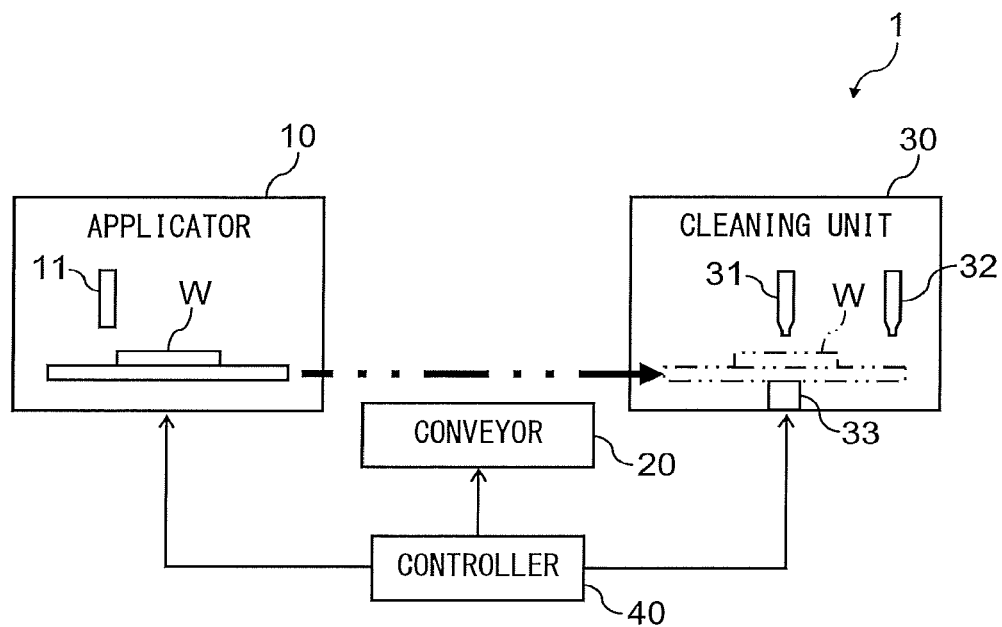
FIG. 1 is a diagram illustrating a schematic configuration of an imprint template manufacturing apparatus according to one embodiment.

As illustrated in FIG. 1, a template manufacturing apparatus 1 of the embodiment includes an applicator 10 that applies a liquid-repellent material in liquid form to a template W, a conveyor 20 that conveys the template W, a cleaning unit 30 that cleans the coated template W, and a controller 40 that controls each unit.

The applicator 10 includes a supply head 11 configured to supply a liquid-repellent material in liquid form onto the template W. The applicator 10 supplies the liquid-repellent material from the supply head 11 to the surface of the template W to apply the liquid-repellent material to a predetermined region of the template W (details will be described later). The applicator 10 is electrically connected to the controller 40, and is driven under the control of the controller 40.

The conveyor 20 conveys the template W coated with the liquid-repellent material from the applicator 10 to the cleaning unit 30. For example, a robot handling device can be used as the conveyor 20. The conveyor 20 is electrically connected to the controller 40, and is driven under the control of the controller 40.

The cleaning unit 30 includes a first supply head 31 configured to supply a solvent onto the template W, a second supply head 32 configured to supply pure water (for example, DIW) onto the template W, and a rotation mechanism 33 configured to hold the template W and rotate it in a horizontal plane. The first supply head 31 and the second supply head 32 are formed so as to be capable of swinging along the surface of the template W and not to interfere with each other's swinging.

While rotating the template W in a horizontal plane about the center of the template W by the rotation mechanism 33, the cleaning unit 30 supplies a solvent from the first supply head 31 or pure water from the second supply head 32 to the center of the surface of the template W, thereby cleaning the template W. For example, a spray nozzle can be used as the first supply head 31 and the second supply head 32. The cleaning unit 30 is electrically connected to the controller 40, and is driven under the control of the controller 40.

The controller 40 includes a microcomputer configured to intensively control each unit, and a storage (both not illustrated) configured to store various programs and process information, and the like related to coating process, conveying process and cleaning process. The controller 40 controls the applicator 10 to apply a liquid-repellent material to a predetermined region of the template W based on the process information and various programs. Further, the controller 40 controls the conveyor 20 to convey the coated template W from the applicator 10 to the cleaning unit 30 based on the process information and various programs. The controller 40 controls the cleaning unit 30 to clean the coated template W based on the process information and various programs.

(Template)

Figure 2:
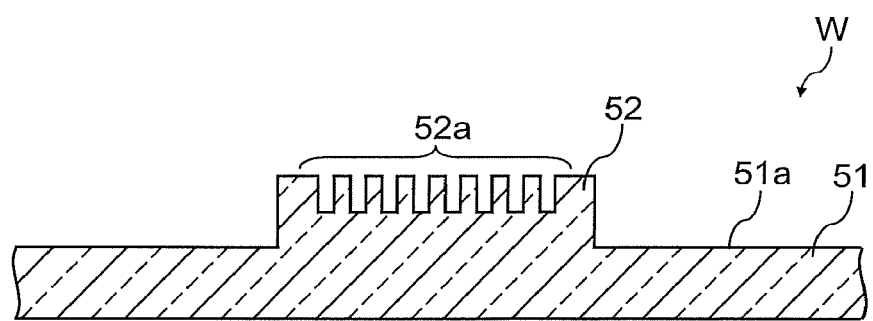
FIG. 2 is a cross-sectional view illustrating a schematic configuration of a template according to one embodiment.

With reference to FIG. 2, a description will be given of the template W as an object to be coated. As illustrated in FIG. 2, the template W includes a base 51 having a main surface 51a and a convex portion 52 provided on the main surface 51a of the base 51.

The base 51 has translucency, and is formed in a plate shape in which the main surface 51a is a flat surface. The plate shape of the base 51 is, for example, square or rectangular; however, the shape is not particularly limited. For example, a transparent substrate such as a quartz substrate can be used as the base 51. Note that, in an imprint process, light such as ultraviolet rays is irradiated to the surface opposite to the main surface 51a.

The convex portion 52 has translucency, and is integrally formed with the base 51 from the same material. A concavo-convex pattern 52a is formed on an end surface of the convex portion 52, i.e., the surface (upper surface in FIG. 2) opposite to the main surface 51a side. The concavo-convex pattern 52a is pressed against a liquid transfer-receiving material (for example, photocurable resin). The pattern region in which the concavo-convex pattern 52a is formed on the end surface of the convex portion 52 is, for example, a square or rectangular region; however, the shape is not particularly limited.

(Applicator)

Figure 3:
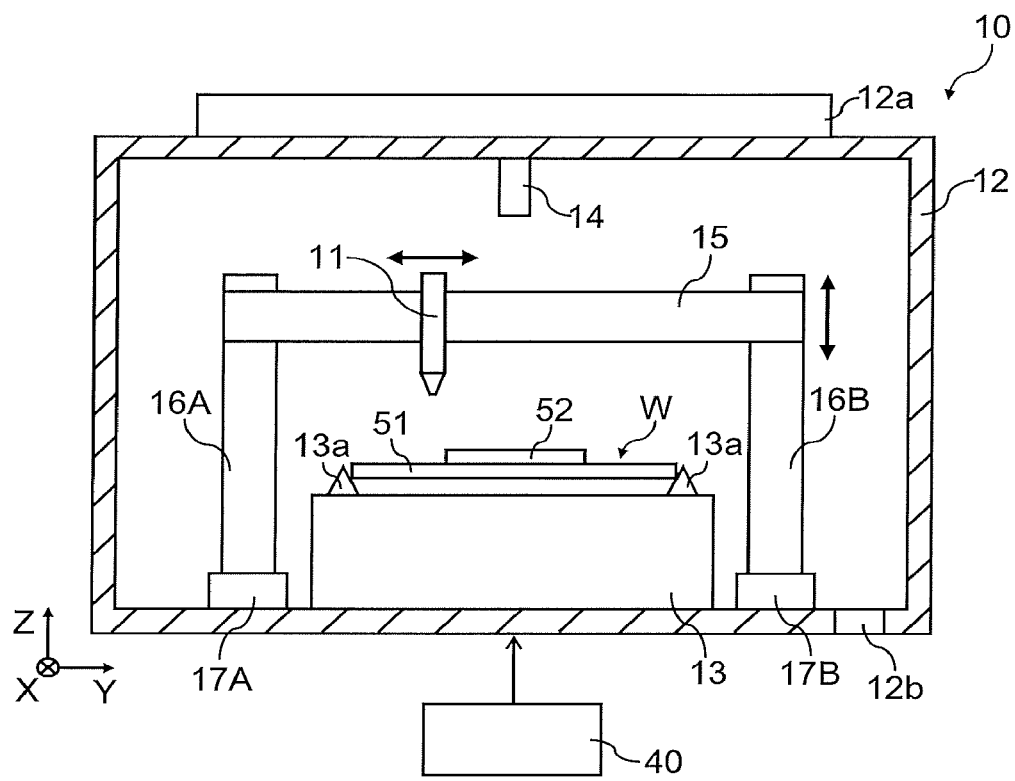
FIG. 3 is a diagram illustrating a schematic configuration of an applicator according to one embodiment.

As illustrated in FIG. 3, in addition to the supply head 11, the applicator 10 further includes a treatment chamber 12 for treating the template W, a stage 13 on which the unprocessed template W is placed, an imaging unit 14 configured to photograph the template W on the stage 13, a Y-axis moving mechanism 15 configured to move the supply head 11 in the Y-axis direction, a pair of Z-axis moving mechanisms 16A and 16B configured to move the Y-axis moving mechanism 15 together with the supply head 11 in the Z-axis direction, and a pair of X-axis moving mechanisms 17A and 17B configured to move the Z-axis moving mechanisms 16A and 16B in the X-axis direction.

The supply head 11 is a dispenser configured to discharge a liquid-repellent material in liquid form. The supply head 11 stores the liquid-repellent material supplied from a tank or the like outside the treatment chamber 12, and discharges the liquid-repellent material stored therein toward the template W on the stage 13 at a predetermined timing. The supply head 11 is electrically connected to the controller 40, and is driven under the control of the controller 40.

The liquid-repellent material in liquid form is a material that has translucency and repels the liquid transfer-receiving material (liquid material to be transferred). The liquid-repellent material contains a liquid-repellent coating agent (for example, silane coupling agent). The liquid-repellent coating agent is a solution containing a liquid-repellent component that repels the liquid transfer-receiving material, a non-liquid-repellent component that cannot repel the liquid transfer-receiving material, and a volatile solvent that dissolves the liquid-repellent component. Both the liquid-repellent component and the non-liquid-repellent component react with the surface of the template W. For example, the liquid-repellent component is a component having a boiling point lower than 250° C., and the non-liquid-repellent component is a component having a boiling point of 250° C. or higher.

The treatment chamber 12 is formed in a box shape so as to be able to accommodate the supply head 11, the stage 13, the imaging unit 14, the moving mechanisms 15, 16A, 16B, 17A and 17B, and the like. A filter 12a is provided to the upper surface of the treatment chamber 12 to remove foreign matters in the air. An exhaust port 12b is provided to the lower surface (bottom surface) of the treatment chamber 12. In the treatment chamber 12, air flows from the filter 12a to the exhaust port 12b, and the inside of the treatment chamber 12 is kept clean by a down flow (vertical laminar flow). As the filter 12a, for example, a ULPA filter, a HEPA filter, or the like can be used.

The stage 13 includes a plurality of support members 13a such as pins, and is a support unit that supports the template W by the support members 13a. The stage 13 is fixed to the bottom surface of the treatment chamber 12; however, it is not so limited. For example, the stage 13 may be moved in the horizontal direction such as the X-axis direction and the Y-axis direction or the vertical direction such as the Z-axis direction.

The imaging unit 14 is attached to the upper surface of the treatment chamber 12 so as to be able to capture images of the template W on the stage 13, in particular, the convex portion 52 and the surroundings thereof. The imaging unit 14 is electrically connected to the controller 40, and sends captured images (for example, a planar image of the convex portion 52) to the controller 40.

The Y-axis moving mechanism 15 supports the supply head 11, and guides the supply head 11 in the Y-axis direction to move it. The pair of Z-axis moving mechanisms 16A and 16B horizontally support the Y-axis moving mechanism 15, and guides the Y-axis moving mechanism 15 together with the supply head 11 in the Z-axis direction to move them. The Y-axis moving mechanism 15 and the Z-axis moving mechanisms 16A and 16B are arranged in a portal shape. The pair of X-axis moving mechanisms 17A and 17B support the Z-axis moving mechanisms 16A and 16B in an upright state, and guide the Z-axis moving mechanisms 16A and 16B in the X-axis direction to move them.

The Y-axis moving mechanism 15 and the pair of X-axis moving mechanisms 17A and 17B function as a horizontal moving mechanism that moves the supply head 11 and the stage 13 relatively in the horizontal direction. Besides, the pair of Z-axis moving mechanisms 16A and 16B function as a vertical moving mechanism that moves the supply head 11 and the stage 13 relatively in the vertical direction. The moving mechanisms 15, 16A, 16B, 17A, and 17B are electrically connected to the controller 40, and are driven under the control of the controller 40. Examples of the moving mechanisms 15, 16A, 16B, 17A, and 17B include various moving mechanisms such as linear motor moving mechanisms, air stage moving mechanisms, and feed screw moving mechanisms.

Next, a description will be given of the coating process, conveying process and cleaning process performed by the template manufacturing apparatus 1.

(Coating Process)

Figure 4:
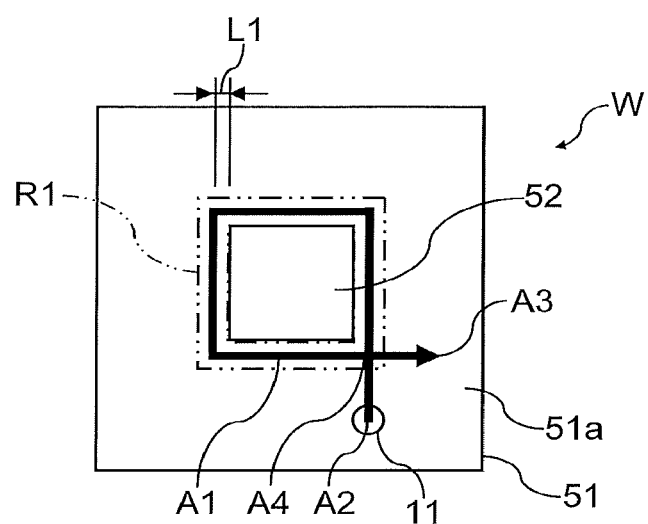
FIG. 4 is a plan view for explaining a coating process according to one embodiment.

As illustrated in FIG. 4, in the coating process of the applicator 10, the supply head 11 is moved by the moving mechanisms 15, 17A and 17B along an application path A1 (see a bold arrow line in FIG. 4) on the main surface 51a of the template W while maintaining a predetermined height, and continuously supplies the liquid-repellent material in liquid form to the main surface 51a of the template W on the stage 13.

The application path A1 extends from a discharge start position A2 on the main surface 51a to a discharge stop position A3 on the main surface 51a along the outer periphery of the convex portion 52 on the main surface 51a. The path surrounding the convex portion 52 of the application path A1 is separated from the side surface of the convex portion 52 by a predetermined distance L1 (for example, 5 mm). The discharge start position A2 is a position where the supply head 11 starts discharging a liquid-repellent material. The discharge stop position A3 is a position where the supply head 11 stops the discharge of the liquid-repellent material. The discharge start position A2 and the discharge stop position A3 are located outside a coating region (a supply region) R1 around the convex portion 52 in the main surface 51a of the template W on the stage 13. The coating region R1 around the convex portion 52 has, for example, a frame shape, and the aspect size (edge width) of the frame-shaped coating region R1 is, for example, 10 mm or more and 20 mm or less.

First, the supply head 11 faces the discharge start position A2 on the main surface 51a of the template W on the stage 13, and starts discharging a liquid-repellent material in liquid form. Subsequently, the supply head 11 relatively moves along the application path A1 on the main surface 51a of the template W, that is, along the outer periphery of the convex portion 52 on the main surface 51a, while discharging the liquid-repellent material, and continuously supplies the liquid-repellent material into the coating region R1 on the main surface 51a. Since the liquid-repellent material supplied into the coating region R1 spreads due to the wettability, the entire area of the coating region R1 is coated with the liquid-repellent material. Then, the supply head 11 faces the discharge stop position A3 on the main surface 51a of the template W on the stage 13, and stops the discharge of the liquid-repellent material. The controller 40 controls the supply head 11 and each of the moving mechanisms 15, 16A, 16B, 17A, and 17B, and the like according to the process information and various programs such that the supply head 11 moves along the application path A1 and continuously discharges the liquid-repellent material as described above.

Figure 5:
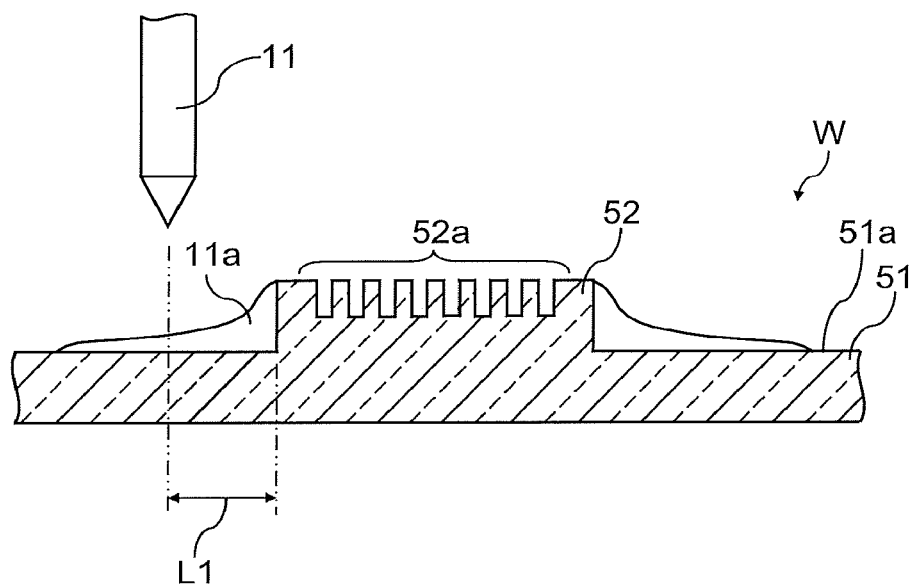
FIG. 5 is a cross-sectional view for explaining a coating process according to one embodiment.

In this coating process, as illustrated in FIG. 5, a liquid-repellent material 11a supplied from the supply head 11 to the main surface 51a of the template W spreads due to the wettability, and reaches the side surface of the convex portion 52 on the main surface 51a. At this time, instead of climbing over the side surface of the convex portion 52, the spread liquid-repellent material 11a adheres to the side surface due to the surface tension. When the volatile solvent contained in the liquid-repellent material 11a, which adheres to the side surface of the convex portion 52 and spreads on the main surface 51a, is completely volatilized and dried, as illustrated in FIG. 6, a liquid-repellent layer 53 is formed on at least the side surface (side wall) of the convex portion 52, for example, on the entire side surface of the convex portion 52 and a part of the main surface 51a, so as to avoid the concavo-convex pattern 52a on the convex portion 52.

Figure 6:
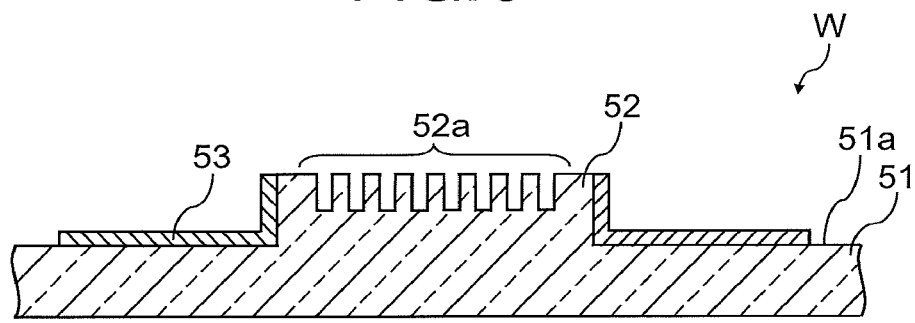
FIG. 6 is a cross-sectional view illustrating a schematic configuration of a coated template according to one embodiment.

More specifically, as illustrated in FIG. 6, the liquid-repellent layer 53 is formed on the entire side surface of the convex portion 52 so as to avoid the concavo-convex pattern 52a on the convex portion 52, and also in a predetermined region on the main surface 51a that is continuous to the side surface of the convex portion 52. Since the convex portion 52 has, for example, a square or a rectangular parallelepiped shape, the predetermined region around it on the main surface 51a is a quadrangular annular region in a planar view; however, the shape of the convex portion 52 and that of the annular predetermined region are not particularly limited. The liquid-repellent layer 53 has translucency, and repels the liquid transfer-receiving material. Although the liquid-repellent layer 53 is described as being formed on the entire side surface of the convex portion 52, it is not so limited. The liquid-repellent layer 53 is only required to be formed on at least a part of the side surface of the convex portion 52.

The predetermined distance L1 in the application path A1 is set, based on the height position of the supply head 11, the supply amount and wettability of the liquid-repellent material, and the like, at a position separating from the side surface of the convex portion 52 of the template W on the stage 13, where the liquid-repellent material 11a supplied to the main surface 51a of the template W on the stage 13 from the supply head 11 spreads and adheres to the upper end of the side surface of the convex portion 52 without climbing over the side surface of the convex portion 52 (see FIG. 5). Incidentally, the setting of the supply position may be based on a result of dummy discharge performed in advance using a dummy template.

After completion of the coating, the template W is left for a predetermined period of time (for example, 5 minutes or more and 10 minutes or less) until the residual solvent, that is, the residual volatile solvent is completely volatilized. At this time, the liquid-repellent component contained in the liquid-repellent material 11a reacts with the surface of the template W to form the liquid-repellent layer 53. The liquid-repellent layer 53 contains the non-liquid-repellent component contained in the liquid-repellent material 11a. Thus, the liquid-repellent layer 53 contains both the liquid-repellent component and the non-liquid-repellent component. In this case, the liquid repellency of the liquid-repellent layer 53 is lowered, resulting in a decrease in liquid-repellent property of the template W.

Besides, the controller 40 limits the conveyance of the template W by the conveyor 20 for the predetermined time for which the template W is left. As a result, the movement of the template W is prohibited for the predetermined time, and the template W is prevented from moving before the liquid-repellent material 11a is dried. As a result, the liquid-repellent material 11a is less likely to move from a desired position due to vibration or the like caused by the movement of the template W and to be separated from the side surface of the convex portion 52. Thus, the liquid-repellent layer 53 can be reliably formed on the side surface of the convex portion 52.

(Conveying Process and Cleaning Process)

Figure 7:
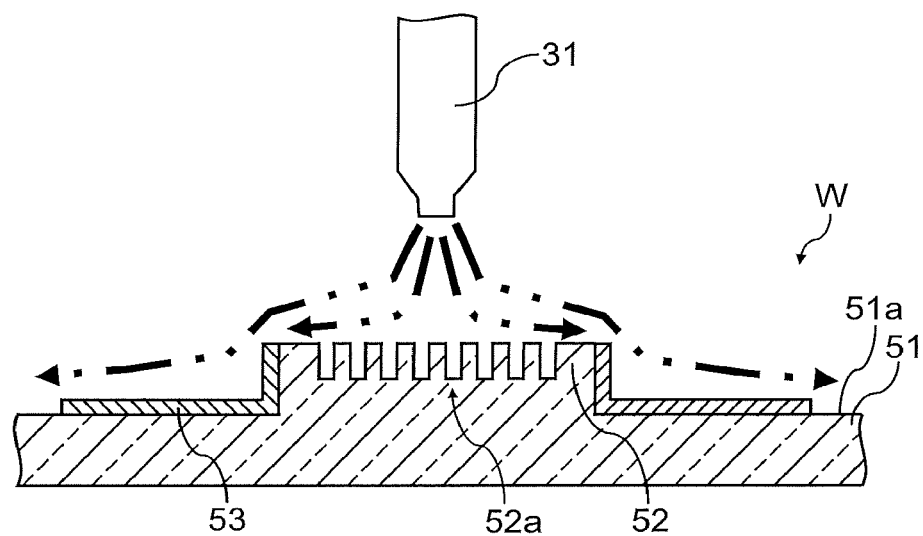
FIG. 7 is a cross-sectional view for explaining a cleaning process according to one embodiment.

The template W coated with the liquid-repellent material 11a is conveyed from the applicator 10 to the cleaning unit 30 by the conveyor 20 (see FIG. 1). As illustrated in FIG. 7, first, the first supply head 31 is set to face the center of the main surface 51a of the template W, i.e., the center of the end surface of the convex portion 52, and the solvent is supplied from the first supply head 31 to the center of the end surface of the convex portion 52 of the template W without rotating the template W. At this time, the flow rate is, for example, 1 L/min or more. After a predetermined time (for example, 15 seconds) from the start of the supply, the cleaning unit 30 causes the rotation mechanism 33 to start rotating the template W in a horizontal plane about the center of the template W as the rotation center. At this time, the first supply head 31 continues to supply the solvent to the main surface 51a of the template W. Thereby, the surface of the template W is cleaned.

A fluorine-based volatile solvent is used as the cleaning liquid for the cleaning. The fluorine-based volatile solvent dissolves the non-liquid-repellent component. As the fluorine-based volatile solvent, for example, a fluorine-based inert liquid can be used. Examples of the fluorine-based inert liquid include Fluorinert (registered trademark), Galden (registered trademark), Novec (registered trademark), and the like. When Galden or Novec is used, solvent volatilization time can be shortened since Galden and Novec have higher volatility than Fluorinert.

The volatile solvent contained in the liquid-repellent material (solvent that dissolves the liquid-repellent component) functions as a first volatile solvent, while the fluorine-based volatile solvent (solvent that dissolves the non-liquid-repellent component) functions as a second volatile solvent. Both the first volatile solvent and the second volatile solvent can be fluorine-based solvents; however, the first volatile solvent and the second volatile solvent are different types of solvents, and the second volatile solvent is more volatile than the first volatile solvent. Besides, the first volatile solvent reacts with the quartz, while the second volatile solvent does not react with the quartz.

In the cleaning using the solvent, a fluorine-based volatile solvent that dissolves the non-liquid-repellent component is supplied onto the template W. As a result, the non-liquid-repellent component contained in the liquid-repellent layer 53 on the template W is dissolved by the fluorine-based volatile solvent and removed from the liquid-repellent layer 53. This suppresses the mixing of the liquid-repellent component and the non-liquid-repellent component in the liquid-repellent layer 53, and increases the liquid repellency of the liquid-repellent layer 53. Thus, the liquid-repellent property of the template W can be improved.

The solvent is supplied to the center of the end surface of the convex portion 52 of the template W. With this, a flow of the solvent is generated from the center of the end surface of the convex portion 52 of the template W toward the outer periphery thereof. This suppresses the non-liquid-repellent component dissolved in the fluorine-based volatile solvent from returning to the concavo-convex pattern 52a side on the convex portion 52. Thus, it is possible to suppress the occurrence of abnormality of the template W due to adhesion of the non-liquid-repellent component to the concavo-convex pattern 52a. When the non-liquid-repellent component adheres to the concavo-convex pattern 52a on the convex portion 52, it becomes a foreign matter. When the concavo-convex pattern 52a of the template W to which such a foreign matter has adhered is pressed against the transfer-receiving material, the concavo-convex pattern 52a on the template W side is damaged. As a result, abnormality occurs in the template W. Further, if pattern transfer is continuously performed using a template having such a damaged concavo-convex pattern or a template to which the non-liquid-repellent component adheres, a defect is generated in the pattern of the transfer-receiving material, resulting in the occurrence of pattern abnormality.

Further, a flow of the solvent is generated from the center of the end surface of the convex portion 52 of the template W toward the outer periphery thereof. Therefore, it is possible to suppress the occurrence of the stagnation of the solvent accumulated on the concavo-convex pattern 52a and the main surface 51a due to a vortex or a backflow of the solvent. Thereby, it is possible to suppress the occurrence of abnormality of the template W caused by the stagnation. Specifically, the non-liquid-repellent component contained in the stagnation is suppressed from adhering to the concavo-convex pattern 52a on the convex portion 52 and remaining on the concavo-convex pattern 52a as a foreign matter. Thus, the occurrence of the template abnormality and pattern abnormality described above can be suppressed.

In addition, first, the cleaning unit 30 supplies the solvent to the center of the main surface 51a of the template W without rotating the template W. That is, after the supply of the solvent is started, the cleaning unit 30 rotates the template W. If the solvent is supplied while the template W is being rotated, the liquid may splash on the template W. Therefore, the template W is rotated after the supply of the solvent is started as described above. With this, liquid splashing on the template W can be suppressed. Thus, it is possible to suppress the occurrence of abnormality of the template W due to the splashing of the liquid.

After the cleaning with the solvent described above, the cleaning unit 30 replaces the first supply head 31 with the second supply head 32 and set the second supply head 32 to face the center of the main surface 51a of the template W, i.e., the center of the end surface of the convex portion 52. Pure water is supplied from the second supply head 32 to the center of the end surface of the convex portion 52 of the template W for a predetermined time (for example, 300 seconds) to clean the surface of the template W. At this time, the template W has been rotating since the cleaning with the solvent described above, and the second supply head 32 swings in a direction along the surface of the template W. By this cleaning, particles on the surface of the template W are removed, and the surface of the template W is cleaned. Thereafter, in a state where the supply of the cleaning liquid is stopped, the rotational speed of the template W is increased to a predetermined value (for example, 700 rpm), and the template W is dried for a predetermined time (for example, 180 seconds). After drying, the template W is conveyed to the next step. Note that ozone water (20 ppm) may be supplied for a predetermined time (for example, 60 seconds) before pure water is supplied.

(Imprint Process)

Figure 8:
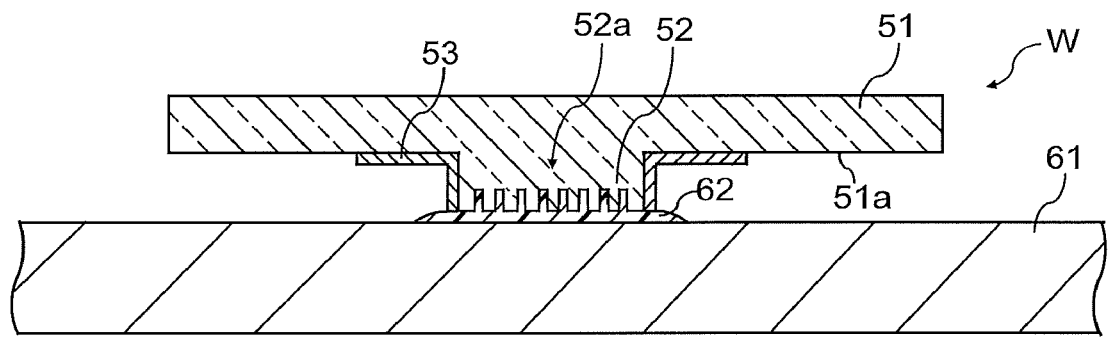
FIG. 8 is a cross-sectional view for explaining an imprint process according to one embodiment.

In the imprint process, as illustrated in FIG. 8, the template W, on which the liquid-repellent layer 53 is formed, is treated such that the concavo-convex pattern 52a on the convex portion 52 is directed to a liquid transfer-receiving material 62 (for example, photocurable resin) on a workpiece 61 (for example, semiconductor substrate), and is pressed against the liquid transfer-receiving material 62 on the workpiece 61. At this time, the liquid transfer-receiving material 62 seeps out from between the end surface of the convex portion 52 and the workpiece 61. However, since the liquid-repellent layer 53 is formed on the side surface of the convex portion 52, the liquid transfer-receiving material 62 is repelled by the liquid-repellent layer 53. In other words, the liquid-repellent layer 53 has the function of repelling the liquid transfer-receiving material 62. This suppresses the adhesion of the liquid transfer-receiving material 62 to the side surface of the convex portion 52. Thus, the liquid transfer-receiving material 62 is suppressed from being raised along the side surface of the convex portion 52.

Next, in a state where the concavo-convex pattern 52a on the convex portion 52 is pressed against the liquid transfer-receiving material 62, the liquid transfer-receiving material 62 is irradiated with light such as ultraviolet rays from the surface opposite to the surface on which the concavo-convex pattern 52a is formed. When the liquid transfer-receiving material 62 is cured by the light irradiation, the template W is separated from the cured transfer-receiving material 62. With this, the concavo-convex pattern 52a on the convex portion 52 is transferred to the liquid transfer-receiving material 62. In general, such an imprint process is repeated over the entire surface of the workpiece 61, and pattern transfer is repeatedly performed; however, the number of times of imprint is not particularly limited.

Note that the liquid transfer-receiving material 62 is not limited to a liquid photocurable resin, but may be, for example, a liquid thermosetting resin. In this case, the liquid transfer-receiving material 62 is cured by heating it with a heating unit such as, for example, a heater or a light source.

(Result of Determination on Liquid Repellency of Liquid-Repellent Layer Dependent on Type of Cleaning Liquid)

FIG. 9 illustrates the determination result of the liquid repellency of the liquid-repellent layer depending on the type of the cleaning solvent.

As illustrated in FIG. 9, using a variety of solvents (surfactant, acid solvent, alkali solvent, organic solvent, and fluorine-based solvent), and tests were carried out with respect to each type of solvent to determine the liquid repellency of the liquid layer that depends on the type of solvent (pass/fail).

In the test for obtaining the determination result, the determination result is obtained by the same test procedure for each type of solvent. As a test procedure, first, a liquid-repellent material in liquid form is applied to a test substrate (for example, bare silicon) by a predetermined amount (for example, 0.05 ml). The test substrate coated with the liquid-repellent material is left for a predetermined time (for example, one hour), and a liquid-repellent layer is formed on the test substrate. The test substrate having the liquid-repellent layer formed thereon is immersed in one type of solvent for a predetermined time (for example, 30 minutes). Thereafter, the test substrate having the liquid-repellent layer formed thereon is taken out from the solvent, washed with water for a predetermined time (for example, 5 minutes), and dried by blowing gas such as $N_2$.

Next, a resist (an example of the transfer-receiving material 62) is dropped on the liquid-repellent layer formed on the test substrate, and the contact angle of the resist with respect to the liquid-repellent layer is measured. When the contact angle is, for example, 65 degrees or more, the solvent used in the test is determined to be acceptable (pass). The solvent can eliminate the residue of the non-liquid-repellent component. On the other hand, when the contact angle is smaller than, for example, 65 degrees, the solvent used in the test is determined to be rejected (fail). The solvent cannot sufficiently eliminate the residue of the non-liquid-repellent component. When the contact angle of the liquid-repellent layer is 65 degrees or more, the liquid-repellent layer of the template W is considered to have sufficient function of repelling the transfer-receiving material. In this manner, determination (pass/fail) is made as to the liquid repellency of the liquid-repellent layer that depends on the type of cleaning liquid as illustrated in FIG. 9 is obtained.

As illustrated in FIG. 9, it was found that the surfactant, the acid solvent, the alkali solvent, and the organic solvent were rejected (fail), and only the fluorine-based solvent passed (pass). Therefore, by using a fluorine-based solvent for the aforementioned cleaning, residue of the non-liquid-repellent component can be prevented. This increases the contact angle of the resist with respect to the liquid-repellent layer. Thus, the liquid repellency of the template W can be improved. Incidentally, examples of the fluorine-based volatile solvent include Fluorinert, Galden, Novec and the like.

As described above, according to the embodiment, the liquid-repellent material 11a in liquid form is applied to the side surface of the convex portion 52 so as to avoid the concavo-convex pattern 52a on the convex portion 52 of the template W. Thereby, the liquid-repellent layer 53 can be formed on at least a part of the side surface of the convex portion 52 so as to avoid the concavo-convex pattern 52a. With this, in the imprint process, the liquid transfer-receiving material 62 that has seeped out from between the convex portion 52 of the template W and the workpiece 61 is repelled by the liquid-repellent layer 53. This suppresses the adhesion of the liquid transfer-receiving material 62 to the side surface of the convex portion 52. Thereby, it is possible to obtain the template W that can suppress a part of the cured transfer-receiving material 62 from being raised, thereby suppressing the occurrence of pattern abnormality. Moreover, it is possible to obtain the template W that can suppress the breakage of the template W and the biting of a foreign matter, thereby suppressing the occurrence of pattern abnormality and template abnormality.

Since the liquid-repellent material 11a is a solution that contains a liquid-repellent component and a non-liquid-repellent component, the liquid-repellent component and the non-liquid-repellent component may coexist in the liquid-repellent layer 53 formed on the side surface of the convex portion 52. In this case, the liquid repellency of the liquid-repellent layer 53 is lowered. In other words, the contact angle of the liquid transfer-receiving material 62 with respect to the liquid-repellent layer 53 is small. Consequently, the liquid-repellent property of the template W is lowered. Therefore, as described above, when the cleaning with the solvent is performed, a fluorine-based volatile solvent that dissolves the non-repellent component contained in the liquid-repellent material 11a is supplied to the template W. Thereby, the non-repellent component contained in the liquid-repellent layer 53 on the template W is dissolved by the fluorine-based volatile solvent and removed from the liquid-repellent layer 53. This suppresses the mixing of the liquid-repellent component and the non-liquid-repellent component in the liquid-repellent layer 53 and increases the liquid repellency of the liquid-repellent layer 53. That is, the contact angle of the liquid transfer-receiving material 62 against the liquid-repellent layer 53 is increased. Thus, the liquid-repellent property of the template W can be improved.

In addition, by the use of the supply head 11 configured to apply the liquid-repellent material 11a in liquid form to the template W, the liquid-repellent layer 53 can be easily formed on the side surface of the convex portion 52 so as to avoid the concavo-convex pattern 52a on the convex portion 52. Further, according to the planar shape of the convex portion 52, the liquid-repellent material 11a can be applied to the side surface of the convex portion 52 so as to avoid the concavo-convex pattern 52a on the convex portion 52. The liquid-repellent layer 53 can be reliably formed on the side surface of the convex portion 52.

In the imprint process, when the liquid transfer-receiving material 62 adheres to the side surface of the convex portion 52, generally, the template W is cleaned with a chemical solution to remove the liquid transfer-receiving material 62. However, according to the above embodiment, it is possible to suppress the transfer-receiving material 62 from adhering to the side surface of the convex portion 52. This eliminates the need of the cleaning step for removing the transfer-receiving material 62 from the side surface of the convex portion 52. Thereby, it is possible to eliminate the cleaning step for the template W after the imprint process. Thus, the pattern wear of the template W caused by the cleaning liquid and damage such as pattern collapse can be prevented. As a result, the occurrence of template abnormality can be suppressed.

It is important to form the liquid-repellent layer 53 on at least the side surface of the convex portion 52 so as to avoid the concavo-convex pattern 52a so as not to form the liquid-repellent layer 53 on the concavo-convex pattern 52a. This is to avoid poor transfer (misprinting) of the concavo-convex pattern 52a with respect to the liquid transfer-receiving material 62. That is, the concavo-convex pattern 52a is a fine pattern having a width of nanometer size. Therefore, if the liquid-repellent layer 53 is formed on the concavo-convex pattern 52a, even if it is a little, the accuracy of the dimensional width of the concavo-convex pattern 52a cannot be maintained due to the thickness of the liquid-repellent layer 53 added thereto. As a result, pattern abnormality occurs at the time of transfer.

In the continuous discharge of the liquid in the above coating process, the supply conditions such as the height position of the supply head 11, the discharge amount, the moving speed, and the like are set such that the liquid-repellent material discharged from the supply head 11 toward the coating region R1 does not splash on the main surface 51a and adhere to the concavo-convex pattern 52a on the convex portion 52, for example, such that the liquid-repellent material discharged from the supply head 11 toward the coating region R1 does not splash on the main surface 51a. However, even if the supply conditions for the liquid-repellent material are set as described above, when the supply head 11 starts or stops the discharge of the liquid-repellent material while facing a position in the coating region R1, the liquid-repellent material may splash on the main surface 51a and adhere to the concavo-convex pattern 52a on the convex portion 52 at that time. This is because the discharge of the liquid and the stop thereof are unstable due to fluctuations in the liquid discharge force and discharge amount of the supply head 11 at the start and stop of liquid supply.

Therefore, as described above, the supply head 11 starts discharging the liquid-repellent material while facing the discharge start position A2 outside the coating region R1, or stops the discharge of the liquid-repellent material while facing the discharge stop position A3 outside the coating region R1. The discharge start position A2 or the discharge stop position A3 is at a distance from the concavo-convex pattern 52a, and the liquid-repellent material can be prevented from splashing on the main surface 51a and adhering to the concavo-convex pattern 52a on the convex portion 52. Thus, the occurrence of pattern abnormality can be reliably suppressed. Further, in order to more reliably suppress the liquid-repellent material from splashing on the main surface 51a and adhering to the concavo-convex pattern 52a on the convex portion 52, it is desirable that the discharge start position A2 and the discharge stop position A3 be located outside the main surface 51a of the template W on the stage 13, that is, outside the outer peripheral edge of the main surface 51a. In this case, the liquid-repellent material does not splash on the main surface 51a. Thus, it is possible to reliably suppress the liquid-repellent material from splashing on the main surface 51a and adhering to the concavo-convex pattern 52a on the convex portion 52.

The supply head 11 may be controlled such that the discharge amount of the liquid-repellent material discharged from the supply head 11 changes before the supply head 11 reaches the discharge stop position A3 from the discharge start position A2. For example, before the supply head 11 reaches the discharge stop position A3 from the discharge start position A2, the liquid-repellent material is doubly applied at a position A4 where the tracks of the supply head 11 overlap. As a result, the liquid-repellent material tends to be thicker at the position A4. If the thickness of the liquid-repellent material becomes non-uniform, agglomerates may be generated. Therefore, it is preferable that the discharge amount of the liquid-repellent material be uniform in the tracks of the supply head 11. For this reason, the discharge amount can be adjusted such that the discharge amount of the supply head 11 is reduced at the position A4 where the tracks overlap. For example, the supply head 11 may be controlled to discharge approximately the same amount of the liquid-repellent material in the position A4 where the tracks overlap and other positions.

Other Embodiments

In the above embodiment, as an example, the liquid-repellent layer 53 is formed on the entire side surface of the convex portion 52 and a part of the main surface 51a continuous to the side surface; however, it is not so limited. For example, the liquid-repellent layer 53 is only required to be formed on at least the side surface of the convex portion 52 so as to avoid the concavo-convex pattern 52a on the convex portion 52. The liquid-repellent layer 53 may be formed on a part of the end surface of the convex portion 52 or on the entire main surface 51a except the convex portion 52 in addition to the side surface of the convex portion 52. Further, the liquid-repellent layer 53 may be formed on a part of the end surface of the convex portion 52 and on the entire main surface 51a except the convex portion 52 in addition to the side surface of the convex portion 52. Besides, it is only required to form the liquid-repellent layer 53 on a portion of the side surface of the convex portion 52 that comes in contact with the transfer-receiving material 62, and the liquid-repellent layer 53 may be only formed on a part of the side surface of the convex portion 52.

While, in the above embodiment, the liquid-repellent layer 53 is described as a single layer by way of example, the liquid-repellent layer 53 is not limited to a single layer, and a stack of a plurality of layers may be used. Further, the side surface (side wall) of the convex portion 52 may be perpendicular to the main surface 51a or may be inclined. In addition, the side surface of the convex portion 52 may be flat or may have a step.

In the above embodiment, as an example, the liquid-repellent material in liquid form is continuously discharged by the supply head 11; however, it is not so limited. The liquid-repellent material may be intermittently discharged (the liquid liquid-repellent material may be dripped). In this case, preferably, the supply head 11 repeatedly drips the liquid-repellent material 11a at a predetermined interval along the application path A1, that is, at an interval at which the liquid-repellent material 11a can be applied to the entire side surface of the convex portion 52.

In the above embodiment, as an example, the application path A1 (supply position) is determined in advance; however, it is not so limited. The imaging unit 14 may capture an image of the upper surface of the convex portion 52 of the template W on the stage 13, and the controller 40 can adjust the supply position according to the planar size and the planar shape of the convex portion 52 based on the image captured. For example, the controller 40 adjusts the supply position such that the distance from the side surface of the convex portion 52 is always the predetermined distance L1 based on the planar size and the planar shape of the convex portion 52. With this, even if the planar size or the planar shape of the convex portion 52 changes, the application position is maintained at the predetermined distance L1 from the side surface of the convex portion 52. Thus, while the liquid-repellent material 11a supplied to the main surface 51a of the template W is prevented from spreading and climbing over the side surface of the convex portion 52, the liquid-repellent material 11a can be reliably applied to the side surface of the convex portion 52.

In the above embodiment, the supply head 11 is described as a dispenser by way of example; however, it is not so limited. Instead of a dispenser, a sponge brush which is soaked with the liquid-repellent material, a pen, an ink jet head which discharges the liquid-repellent material, or the like can be used. In the case of using a sponge brush, a pen or the like, other than the template W in the state as illustrated in FIG. 3, the template W may be reversed such that the convex portion 52 faces downward in the direction of gravity and supported by the support members 13a having some degree of height, and the liquid liquid-repellent material may be applied from below the template W. Alternatively, the template W may be supported such that the main surface 51a is inclined, and the liquid-repellent material may be applied from the oblique direction of the template W.

In the above embodiment, as an example, the liquid-repellent material is supplied to the main surface 51a of the template W such that the liquid-repellent material is applied to the side surface of the convex portion 52 as a result; however, it is not so limited. For example, the liquid-repellent material may be directly applied to the side face of the convex portion 52.

Further, in the above embodiment, the supply head 11 is described as being moved in the X, Y, and Z-axis directions by the horizontal moving mechanism or the vertical moving mechanism by way of example. However, the stage 13 may be moved. In this case, the stage 13 may be provided with a horizontal moving mechanism and a vertical moving mechanism. That is, it suffices if the supply head 11 and the stage 13 can move relative to each other, and either one or both of them may be moved. In this case, the controller 40 can control the relative movement of the stage 13 and the supply head 11.

In the above embodiment, the cleaning unit 30 is described as a spin processor by way of example; however, it is not so limited. For example, by using a tank that contains a solvent or pure water, the coated template W may be immersed in the liquid in the tank.

Although a semiconductor substrate is exemplified as the workpiece 61, it is not limited thereto. The workpiece 61 may be a quartz substrate used as a replica template.

While certain embodiments have been described, these embodiments have been presented by way of example only, and are not intended to limit the scope of the inventions. Indeed, the novel embodiments described herein may be embodied in a variety of other forms; further, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint template manufacturing apparatus, comprising:
 a stage configured to support a template that includes
  a base having a main surface, and
  a convex portion provided on the main surface and having an end surface on which a concavo-convex pattern to be pressed against a liquid transfer-receiving material is formed;
 a supply head configured to supply a liquid-repellent material in liquid form, which repels the liquid transfer-receiving material, to the template on the stage;
 a moving mechanism configured to move the stage and the supply head relative to each other in a direction along the stage;

a controller configured to control the supply head and the moving mechanism such that the supply head applies the cleaning liquid-repellent material to at least a side surface of the convex portion so as to avoid the concavo-convex pattern; and a cleaning unit configured to supply a cleaning liquid to the template coated with the liquid-repellent material, wherein the liquid-repellent material contains
- a liquid-repellent component that reacts with a surface of the template,
- a non-liquid-repellent component that reacts with the surface of the template, and
- a volatile solvent that dissolves the cleaning liquid-repellent component, and the cleaning liquid is a fluorine-based volatile solvent that dissolves the non-liquid-repellent component.

2. The imprint template manufacturing apparatus according to claim 1, wherein the controller is further configured to control the supply head and the moving mechanism such that the supply head supplies the liquid-repellent material to the main surface around the convex portion to apply the liquid-repellent material to the side surface of the convex portion.

3. The imprint template manufacturing apparatus according to claim 1, wherein
the volatile solvent that dissolves the liquid-repellent component is a fluorine-based solvent, and
the fluorine-based volatile solvent is more volatile than the volatile solvent that dissolves the liquid-repellent component.

4. The imprint template manufacturing apparatus according to claim 1, wherein the fluorine-based volatile solvent is a fluorine-based inert liquid.

5. The imprint template manufacturing apparatus according to claim 1, wherein
the cleaning unit includes
- a cleaning supply head configured to supply the cleaning liquid to the template coated with the liquid-repellent material, and
- a rotation mechanism configured to rotate the template coated with the liquid-repellent material in a horizontal plane, and the controller is further configured to control the cleaning supply head and the rotation mechanism such that the rotation mechanism rotates the template after the cleaning supply head starts supplying the cleaning liquid.

* * * * *